(12) United States Patent
Reiss et al.

(10) Patent No.: US 8,440,258 B2
(45) Date of Patent: May 14, 2013

(54) THIN FILMS OF CONJUGATED POLYMERS CONTAINING INORGANIC NANOPARTICLES AND PROCESS FOR THE MANUFACTURE THEREOF

(75) Inventors: Peter Reiss, St Egreve (FR); Julia De Girolamo, La Tronche (FR)

(73) Assignee: Commissariat a l'Energie Atomique, Paris (FR)

( * ) Notice: Subject to any disclaimer, the term of this patent is extended or adjusted under 35 U.S.C. 154(b) by 447 days.

(21) Appl. No.: 12/451,570

(22) PCT Filed: May 27, 2008

(86) PCT No.: PCT/FR2008/050915
§ 371 (c)(1), (2), (4) Date: Mar. 4, 2010

(87) PCT Pub. No.: WO2008/152295
PCT Pub. Date: Dec. 18, 2008

(65) Prior Publication Data
US 2010/0183855 A1    Jul. 22, 2010

(30) Foreign Application Priority Data
May 28, 2007 (FR) ...................... 07 55289

(51) Int. Cl.
| | | |
|---|---|---|
| *B05D 1/36* | (2006.01) | |
| *H01L 31/042* | (2006.01) | |
| *H01L 51/40* | (2006.01) | |
| *B32B 3/00* | (2006.01) | |
| *B32B 7/00* | (2006.01) | |
| *B32B 15/00* | (2006.01) | |
| *B32B 9/04* | (2006.01) | |

(52) U.S. Cl.
USPC ...... 427/202; 136/244; 257/E21.09; 427/205; 428/209; 428/411.1; 438/99

(58) Field of Classification Search ............... 136/244; 428/209, 411.1; 438/99; 977/773; 257/E21.09; 427/202, 205
See application file for complete search history.

(56) References Cited

U.S. PATENT DOCUMENTS

| | | | |
|---|---|---|---|
| 7,309,525 B2 | 12/2007 | Reiss et al. | |
| 2002/0045045 A1* | 4/2002 | Adams et al. | 428/403 |
| 2002/0155442 A1* | 10/2002 | Mirkin et al. | 435/6 |
| 2003/0077625 A1 | 4/2003 | Hutchison | |
| 2003/0226498 A1* | 12/2003 | Alivisatos et al. | 117/84 |

FOREIGN PATENT DOCUMENTS

| | | |
|---|---|---|
| WO | WO 03/081683 | 10/2003 |
| WO | WO 2004/097871 | 11/2004 |

OTHER PUBLICATIONS

Emge et al., "Molecular Recognition Properteis of Nucleobase-functionalized Polythiophenes", Synthetic Metals, 1999, vol. 102, p. 1370-1373.*

* cited by examiner

*Primary Examiner* — Peter F Godenschwager
*Assistant Examiner* — David Karst
(74) *Attorney, Agent, or Firm* — McKenna Long & Aldridge, LLP

(57) ABSTRACT

The invention relates to a process for the non-covalent coating of a support by a hybrid organic/inorganic film, characterized in that it comprises the steps of: —depositing a conjugated organic polymer comprising organic groups of X type onto the support; depositing nanoparticles comprising one or more organic groups of Y type onto the support, and in that the groups of X and Y types are capable of developing hydrogen-type bonds between themselves. Typically, the deposition steps are repeated, generally alternately, until the desired thickness for the film is obtained. The deposition may be carried out on the whole of the support or on one part of the latter only.

19 Claims, 4 Drawing Sheets

Figure 1:
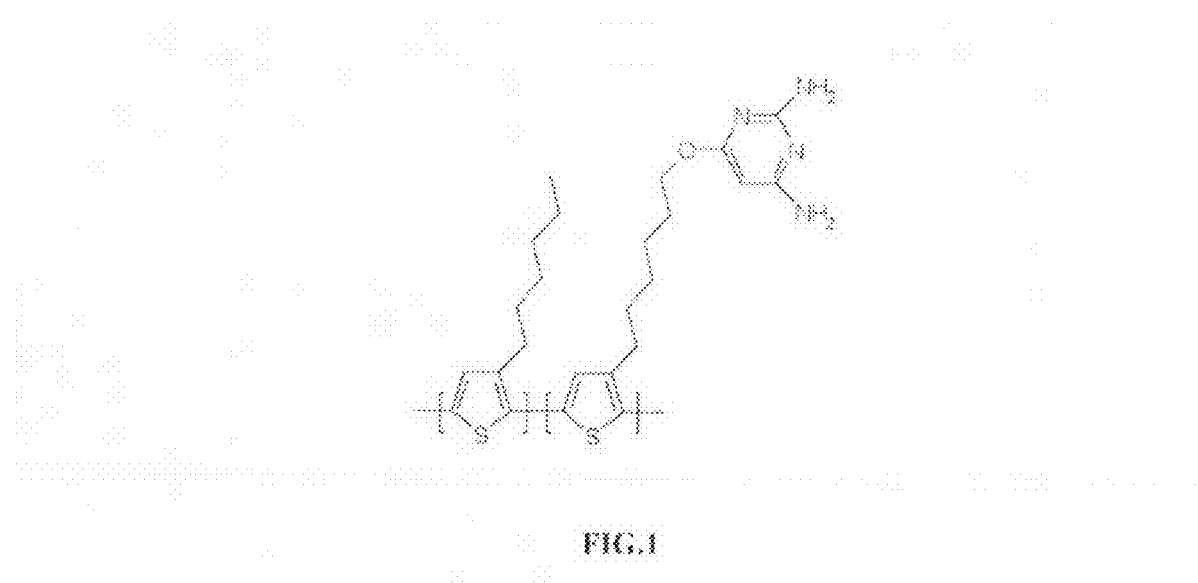

THIN FILMS OF CONJUGATED POLYMERS CONTAINING INORGANIC NANOPARTICLES AND PROCESS FOR THE MANUFACTURE THEREOF

This application is a 35 U.S.C. §371 National Stage entry of International Application No. PCT/FR2008/050915 filed May 27, 2008, which claims priority to French Application No. 0755289 filed May 28, 2007, both of which are hereby incorporated by reference in their entireties as if fully set forth herein.

A large number of applications based on inorganic nanoparticles arise from their optical, electronic or magnetic properties, which depend on their sizes. Significant examples are fluorescent semi-conductor nanocrystals (e.g. CdSe, CdTe, InP, ZnO), the nanoparticles of gold and the nanoparticles of iron oxide or iron-platinum alloy.

Combined with conjugated polymers, the nanocrystals of semi-conductors constitute promising materials for light-electricity conversion by photovoltaic effect. Among other emerging applications, light emitting diodes can be mentioned.

Metallic nanoparticles (e.g. Au) are used in combination with conjugated polymers in non-volatile molecular memories, in electrocatalysis or as chemical sensors.

Magnetic nanoparticles are envisaged as "bits" for storing information in future magnetic storage media or as constituents of novel materials having spin-dependent electronic transport (field of "spintronics").

An emerging application of semi-conductor nanoparticles (NPs) and nanocrystals (NCs) consists of incorporating them into films of conjugated polymers with the purpose of obtaining new materials for photovoltaics. The benefit of the NCs in these devices is double, since they participate in the absorption of sunlight and ensure the transport of electrons.

A first approach to the preparation of the films consists of growing the NCs/NPs in situ in the conjugated polymer. According to this approach the NCs or NPs are made to grow directly in the conjugated polymer [e.g. NPs of Au in poly (hexylthiophene): J. Mater. Chem. 2004, 14, p. 141]. Although this method ensures a good dispersion of the particles in the polymer, it generally does not allow NCs or NPs having a low dispersion by size to be obtained. This is a major drawback, as the physical properties of the NCs/NPs are highly dependent on their size.

Moreover, a new process must be developed for each type of NCs or NPs and the method does not allow the synthesis of the particles and the polymer to be optimized independently.

Another strategy consists of mixing the NCs or NPs with conjugated polymers. This is the method most used for the manufacture of photovoltaic devices from semi-conductor NCs such as CdSe and conjugated polymers, such as poly(3-hexylthiophene) or poly(p-phenylene-vinylene) [e.g. CdSe/PPV solar cells: J. Appl. Phys. 2005, 97, p. 014914, patent EP1485955]. However, it is difficult to control the morphology of the thin films obtained from these mixtures, as a strong phase segregation leads to a reduction in performance of the solar cells.

Another method consisting of successively grafting layers of CdSe nanocrystals and layers of polymer has recently been proposed by [Wang et al., Adv. Funct. Mater., 2006, 16, p. 542]. This technique leads to films in which the polymer and the nanocrystals are covalently linked. Although this method avoids demixing of the two constituents, the strong bond between them prevents the optimization of the structure of the thin film obtained i) by the self-organization process during the deposition; ii) by a procedure of thermal annealing after the deposition. Thermal annealing generally leads to a modification of the morphology of the thin film. This method is widely used for increasing the performance of solar cells based on conjugated polymers and in particular for cells based on conjugated polymers and semi-conductor nanocrystals (EP1485955). However, the films obtained can have morphological defects that it is difficult to treat by the application of annealing, due to the existence of covalent bonds within the film.

The effectiveness of films prepared by the known methods is often limited by the difficulty in controlling the morphology of the films. Generally these materials are obtained by simple mixture of the two constituents, NCs and conjugated polymer, which most often causes a phase segregation effect, i.e. a demixing, giving rise to zones rich in polymer and zones rich in NCs. On the other hand, the spin-coating technique commonly used for producing films is costly in terms of material consumption as it involves the loss of a large fraction of products at the time of deposition.

In summary, the methods for manufacturing thin films containing NCs or NPs in a conjugated polymer used at present do not allow simple and economic implementation while ensuring control of the morphology and the composition of the material obtained.

The invention relates to a process for the non-covalent coating of a support by a hybrid organic-inorganic film, characterized in that it comprises the steps of:
depositing a conjugated organic polymer comprising organic groups of X type onto the support;
depositing nanoparticles comprising one or more organic groups of Y type onto the support;
and in that the groups of X and Y types are capable of developing hydrogen-type bonds between themselves.

Typically the deposition steps are repeated, generally alternately, until the desired thickness for the film is obtained. The deposition may be carried out on the whole of the support or on one part of the latter only.

Within the meaning of the present invention, a hybrid organic/inorganic film corresponds to a film constituted by organic and inorganic species and in particular a film comprising successive alternating layers. More specifically, these are polymer films in which there are layers of inorganic nanoparticles; conceptually this type of film exhibits an alternation between the polymer layers and the inorganic layers.

The films in question here are generally considered to be films which are optically thin, their thickness being comprised between the nanometric and micrometric scales.

The process is of the "non-covalent" type in that the cohesion of the film and that of the film to the support is not ensured by interactions of the covalent type. Thus, the process does not give rise to the development of covalent bonds between the different constituents of the film, i.e. the polymer and the nanoparticles, nor to the development of covalent bonds between the support and the constituents of the film in contact with its surface.

The organic groups of X and Y types correspond to chemical groups having an affinity for each other and in particular chemical groups developing hydrogen bonds with each other. This type of bond is a form of association between an electronegative atom and a hydrogen atom, itself bonded to a second relatively electronegative atom. The two electronegative atoms usually, but not necessarily, belong to the first row of the periodic table of the elements, these are in particular N, O and F. The atoms comprising free doublets, such as oxygen, nitrogen or also halogens, or electron deficient atoms, such as boron, can easily be involved in this type of bond.

Thus X and Y will typically correspond to chemical groups comprising functions having electronegative atoms, such as the carbonylated functions or also the imines, or hydrogens as described above, such as exist in the alcohol or amine functions. A person skilled in the art is able to determine the groups capable of being used within the framework of the invention.

Typically X and Y will form a pair having within them, in the case of X the carbon-containing structure of formula (I):

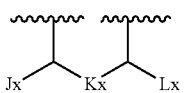

and in the case of Y the carbon-containing structure of formula (II)

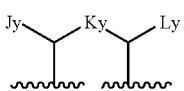

in which:
hydrogen bonds are capable of forming in at least two of the pairs Jx/Jy, Kx/Ky, Lx/Ly;
for the pair Jx/Jy, one of the Js represents an N or an O covalently bonded to a hydrogen and the other represents an N or an O comprising a π-type bond;
for the pair Kx/Ky, one of the Ks represents a nitrogen atom covalently bonded to a hydrogen, and the other represents an N comprising a π-type bond;
for the pair Lx/Ly, the Ls independently represent hydrogen or carbon atoms, an N or an O covalently bonded to a hydrogen, an N or an O comprising a π-type bond.

The hydrogen bonds are formed preferably in the pairs Jx/Jy and Kx/Ky. Advantageously X and Y have ring structures, typically they will be a ring with 5 or 6 atoms.

X and Y can therefore, for example, correspond to pairs of the diaminopyrimidine/thymine, diaminotriazine/uracil, diaminotriazine/maleimide, diacylamidopyridine/uracil, diaminotriazine/perylene bisimide groups, urea/imide units, or ureido-s-triazine or ureidopyrimidinone dimers. It is thus for example possible to use, as X and Y groups, groups that are identical to or derived from the bases present in the nucleic chains in order to benefit from their complementarity. The purine bases, adenine and guanine, and pyrimidine bases, cytosine, thymine and uracil, as well as their derivatives, of course retaining the structure ensuring the formation of hydrogen bonds, can be used within the framework of the invention as X and Y groups. It is of course preferable for adenine to be used complementarily to thymine or uracil, in order to form two hydrogen bonds, and guanine complementarily to cytosine, in order to form three hydrogen bonds. The choice of pairs known for their complementarity is recommended; under these conditions the cohesion of the film is improved.

The conjugated organic polymers correspond to organic-type polymeric structures within which there is a conjugation. These polymers are known from the prior art, in particular for their applications in the field of electronics; among these there can be mentioned the aromatic, heterocyclic, linear polymers or polymers having alternate heterocycles and double bonds, in particular the poly(aniline)s, poly(alkylthiophene)s, poly(p-phenylene)s, poly(p-phenylene-vinylene)s, poly(fluorene)s, poly(pyrrole)s, poly(acetylene)s, polyaromatic amines, poly(thienylene-vinylene)s and their soluble derivatives which are particularly suitable within the framework of the invention.

According to the invention it is desirable to use conjugated organic polymers comprising organic groups of X type. These polymers are generally copolymers deriving from a conjugated polymer such as defined above, having modified monomeric units which comprise the X group. Typically the X group is present on a side chain so that it does not interfere with the conjugation within the polymer; the quantity of monomeric unit having a substitution by an X group is generally comprised between 5 and 50%, and particularly between 5 and 15%. Thus for example it is possible to use as a polymer comprising organic groups of X type such as a 3-hexylthiophene polymer comprising, at 10 to 15%, monomeric units bearing an organic group of X type such as a 3-hexylthiophene bonded to a 6-oxy-2,4-diaminopyrimidine at the end of the hexyl chain, as shown in FIG. 1.

It is preferable for the X groups used within the polymer to be similar in nature and advantageously for them to be identical. The methods for the preparation of the polymers are known in organic chemistry, the integration of the X group can easily be carried out by derivatization of a monomeric unit as illustrated in the experimental part or as can be found in the literature; to this end it is useful to refer to Mouffouk et al. CHEM. COMMUN. (2004) 2314.

Within the meaning of the present invention a nanoparticle (NP) corresponds to an inorganic particle of nanometric size, in particular these can be nanocrystals (NC). The NPs are typically constituted by at least one metal and/or at least one semi-conductor compound comprising at least one metal. The metals can be chosen in particular from the transition metals, the rare earths, metals from the groups IIIA, IVA and VA of the periodic table of the elements, their alloys, their oxides and mixtures of these metals and alloys. More particularly the invention relates to gold, platinum, silver, copper, titanium oxide, iron oxide, and to iron-platinum, iron-palladium, and cobalt-platinum alloys.

As regards semi-conductors, these can be for example compounds of formula AB with A an element the oxidation state of which is +II and B an element the oxidation state of which is −II, typically A is chosen from Mg, Ca, Sr, Ba, Zn, Cd, Hg, Sn, Pb and mixtures of these elements, and B is chosen from O, S, Se, Te and mixtures of these elements. Among the semiconductors, there can also be mentioned the semi-conductors of formula CD with C being an element the oxidation state of which is +III and D being a element the oxidation state of which is −III, typically C is chosen from Al, Ga, In and mixtures of these elements, and D is chosen from N, P, As, Sb, Bi and mixtures of these elements. The invention also relates to semi-conductors of formula $ECB_2$ with E being an element the oxidation state of which is +I, C being a element the oxidation state of which is +III and B being a element the oxidation state of which is −II, in which B and C are chosen as previously, E is chosen from Cu, Ag, Au. Finally it is of course possible to use simpler semi-conductors such as Si or Ge.

The invention relates in particular to particles used in the photovoltaic field or in the field of electronic memories; these are particularly particles of CdSe, CdTe, ZnO, PbSe, PbS, InP, InN, $CuInS_2$, $CuInSe_2$, $Cu(In,Ga)Se_2$, GaAs, InGaAs, Si, Ge, Au, Ag and Pt.<0} Advantageously for applications in the photovoltaic field these are NPs of CdSe, InP and $CuInSe_2$ and can also be $Cu(In1Ga)Se_2$ and $CuInS_2$ and in the field of electronic memories Au, Ag and Pt.

According to the invention it is desirable to use nanoparticles comprising organic groups of Y type. Such nanoparticles are hybrid organic/inorganic entities. These are in particular a nanoparticle, as mentioned above, to which one or more organic ligands comprising a group of Y type are bonded. Thus a nanoparticle of this type typically has an inorganic core constituted by at least one metal and/or at least one semi-conductor compound comprising at least one metal, to which at least one ligand comprising an organic group of Y type which constitutes a coating or crown of organic nature is bonded. The ligands which can be used within the framework of the invention are in particular ligands of formula (III):

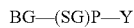

In which:
BG represents a linkage group capable of binding to a nanoparticle of metal and/or at least one semi-conductor compound comprising at least one metal;
SG represents a spacer group;
Y is as defined previously;
p is equal to 0 or 1;

According to the invention BG will be chosen according to the type of nanoparticle used within the framework of the process. BG can bind covalently, by complexing, chelation, or by electrostatic interaction to the surface of the nanoparticles. Usefully, in order to determine the structure most suited to the NP in question, a person skilled in the art can in particular refer to the prior art and particularly to Colloids and Colloid Assemblies, Frank Caruso (Ed.), 1. Ed. December 2003, Wiley-VCH, Weinheim.

BG can in particular be a thiol, a dithiol, a carbodithioate, dithiocarbamate, xanthate, when the particle corresponds to a metal such as gold, silver, copper, platinum, palladium or also when it corresponds to a semi-conductor of AB type such as CdSe, CdTe, ZnO, PbSe, PbS, $CuInS_2$, $CuInSe_2$ or $Cu(In,Ga)Se_2$. In the case of the nanoparticles of oxides, such as titanium, zirconium, aluminium or iron oxide, BG can in particular correspond to a carboxylic acid, dicarboxylic acid, phosphonic acid, diphosphonic acid, sulphonic acid, hydroxamic acid, the acids being capable of being in deprotonated form, as disclosed in the prior art and in particular in Patent Application WO2004097871.

According to the invention it is preferable for p to be equal to 1. A spacer group SG generally corresponds to a group which generally does not develop an interaction other than that of a steric or affinity nature of the hydrophilic or hydrophobic type with the inorganic core of the nanoparticle, the polymer and the substrate, and which does not react with them. Typically, the spacer can be a carbon-containing chain which does not comprise a heteroatom, this can be for example an aliphatic chain, e.g. an alkyl chain, preferably having 1-12 carbon atoms, an aromatic chain, or a heterocyclic chain.

Thus, for example it is possible within the framework of the invention to use in particular NPs of CdSe functionalized with 1-(6-mercaptohexylthymine). Another example corresponds to NPs of gold or NPs of iron oxide, functionalized according to the methods described in the articles Nature 2000, 404, p. 746 and Chem. Mat. 2004, 16, p. 3252 with ligands containing a thymine group. It is also possible to use molecules of carbodithioate, dithiocarbamate or xanthate type containing a thymine function in order to functionalize nanocrystals of CdSe as described in Patent Application EP1548431.

The support can be variable in nature, considering that the invention makes it possible to provide in particular devices in the field of electronics, it is desirable to apply the process to supports constituted by materials used in this field. Considering that the invention corresponds to a process for coating a support, only the nature of the surface of the support is capable of interacting directly with the constituents of the film coating it. Thus these can be in particular supports having a surface of metal, metal alloys, or semi-conductor. More particularly, it is recommended to choose supports having oxides on their surface, to allow in particular the formation of hydrogen bonds between the surface of the support and the polymer or the nanoparticles close to it. Thus, it is advantageous for the organic groups of X type to correspond to groups having the majority of the covalent bonds with the hydrogens capable of being involved in hydrogen bonds with Y, so that a part of the X groups present in the polymer molecules closest to the surface can thus also develop hydrogen bonds with the support in order to increase significantly the cohesion of the film to the support. The support can for example be chosen from glass, mica, silicon, generally having an oxide layer, or also indium tin oxide (ITO).

With reference to a step of deposition on the support, the term "support" must not be understood limitatively; it must be kept in mind that the nature of the "surface" of the "support" develops as successive depositions are carried out. Thus for example if a first deposition of polymer is carried out on a glass support, the surface of which is glass, the second deposition, which will correspond for example to a deposition of nanoparticles, onto the "support" will be carried out on a surface which will correspond to that of a polymer-covered glass support. Similarly, if an additional deposition is carried out on this same support, it must be understood that the deposition is carried out on the outermost "layer", here a "layer" of nanoparticles.

Thus the invention corresponds particularly to a non-covalent process for coating a support with a hybrid organic/inorganic multi-layer film comprising m organic layers and n inorganic layers, characterized in that it comprises the steps of:

(a) depositing a conjugated organic polymer comprising organic groups of X type onto the support;
(b) depositing nanoparticles comprising one or more organic groups of Y type onto the support;
and in that the groups of X and Y types are capable of developing hydrogen-type bonds between themselves.
and in that step (a) is carried out m times and step (b) n times, m and n being greater than or equal to 1.

Steps (a) and (b) are typically carried out successively, as indicated previously; it is moreover preferable for the first step to be step (a). Generally steps (a) and (b) are carried out using liquid solutions comprising the polymer or the nanoparticles. These solutions are prepared with a solvent suited to the compound to be solubilized or dispersed. A person skilled in the art is capable of determining the solvent which can be used, according to whether it is desired to solubilize or disperse; it is recommended to test different solvents as a function of their polarity in order to determine the solvent ensuring adequate solubilization or dispersion.

It is recommended to choose a solvent in which it is possible to solubilize the polymer comprising groups of X type at a concentration at least equal to 0.1 g/L. Generally, it is possible to use the same solvent or a solvent of similar polarity to that used for the conjugated polymer which does not comprise an X group and in particular when their molecular mass is similar, i.e. the difference is equal to 10% at most. For example, in the case of poly(alkylthiophene)s, the appropriate solvents are rather aprotic and apolar. Thus for example regioregular poly(hexylthiophene), typically with $M_n$ of approximately 12800 g/mol, comprising diaminopyrimidine functions can be solubilized in chloroform.

It is recommended to choose a solvent allowing a dispersion of the nanoparticles at a concentration at least equal to 0.1 g/L. Typically the suitable solvents are rather aprotic and polar, they can be for example N,N-dimethylformamide (DMF). In order to counterbalance the ability of certain solvents, such as DMF, to accept hydrogen bonds, a small quantity of methanol is generally added, typically 10% by volume. Thus, for example, NPs of CdSe functionalized with 1-(6-mercaptohexylthymine) can be dispersed in an N,N-dimethylformamide/methanol mixture (10/1 by volume). The solvents used during the synthesis of the nanoparticles which the user wishes to use are often suitable for carrying out dispersion; reference can usefully be made to the associated operating procedures. As regards nanoparticles/nanocrystals it is often advantageous to apply an ultrasound treatment to the solution in order to promote dispersion.

Steps (a) and (b) can in particular be carried out by vaporization of the solutions on the support. Advantageously, steps (a) and (b) are carried out by dipping the support in the corresponding solution, this type of procedure, known as LBL or "layer by layer" deposition, is particularly suitable as it makes it possible to control the quantity of compound which is deposited onto the support. Typically the support is immersed in the solution for a variable period of time which can be comprised between a few minutes (for example 5 minutes, using a concentration of 0.25 g/L), and a few tens of minutes (for example 45 minutes, using a concentration of 4 g/L), depending on the quantity of compound which the user wishes to deposit onto the support and therefore depending on the thickness it is desired to give to the layer. The thickness of each of the layers can easily be modified by varying the dipping time, and the concentration in the solvent of the species to be deposited. A high level of discretion is given to the user with this technique; in this regard, according to the type of application envisaged, a person skilled in the art can refer to the literature and for example to Adv. Mater. 2004, 16, p. 823 which illustrates, for poly(p-phenylene vinylene), the thickness of the thin film of polymer/duration of dipping ratio.

Between each of the steps it is possible to rinse the support with a solvent, this advantageously makes it possible to remove the excess material which does not adhere to the support, and in particular in the case of the NPs, to get rid of a solvent which can accept hydrogen bonds, such as DMF. The solvent used will generally correspond to that of the last solution used or to another solvent and particularly a volatile solvent which does not develop hydrogen bonds with the layers already present on the support. It is also possible to evaporate any residual solvent which may be present on completion of the deposition steps. For this purpose, it is possible to await the evaporation of the solvent under standard temperature and pressure (STP) conditions or to use a flow of gas, generally an inert gas, to reduce the ambient pressure or to increase the temperature.

Generally m and n are such that the multilayer film has a total thickness comprised between a few nanometres or a few tens of nanometres, m and n are equal to 1 in this case, and up to a few hundred nanometres, generally with values of m and n greater than 10. Thicknesses of approximately 100 nm are typically reached for values of m and n comprised between 6 and 10. Measurements can of course be carried out in order to monitor the thickness of the film by using a profilometer, or the small-angle X-ray scattering method. A person skilled in the art can usefully refer to the example described below.

The invention also relates to a film capable of being obtained according to the arrangements disclosed above. More generally, the subject of the invention corresponds to a hybrid organic/inorganic multilayer film characterized in that it comprises:

m layers of conjugated organic polymer comprising organic groups of X type;

n layers of nanoparticles comprising one or more organic groups of Y type;

and in that the groups of types X and Y are capable of developing hydrogen-type bonds between themselves.

The elements of the film can in particular be as defined previously.

The invention also relates to a support, as defined above, covered with a film as defined previously.

The subject of the invention also extends to electronic devices, and in particular to photovoltaic devices, comprising a film as presented previously. Such a device advantageously comprises:

a support partially covered with a film, as disclosed previously;

a metallic layer, for example Al, Ag, Ca or Au, on at least one part of the film;

electrical contacts established between a part of the support not covered with film, which constitutes the anode, and the metallic layer, which constitutes the cathode (e.g. aluminium).

During the use of such devices in the solar field, it is advantageous to include an additional layer between the support covered with a film and the metallic layer, this is generally a layer improving the fill factor (improvement of the $V_{OC}$) and therefore improving the yield of the solar cell conversion device. This layer is for example produced with LiF as stated in the literature (Appl. Phys. Lett. vol 80, p 1288).

Typically such a device is a photovoltaic cell and particularly a photovoltaic cell of heterojunction type with a volume comprising at least two electrodes electrically connected together by the film according to the invention. The electrodes can be independently conductive or semi-conductive. Typically, a conductive electrode comprises a metallic surface of metals such as gold, calcium, aluminium, silver, magnesium, chromium, lithium, or metal alloys. It can also comprise a stack of layers of metal and/or conductive oxide such as $In_2O_3/SnO_2$. It can optionally be covered with a conductive polymer such as a polypyrrole, polythiophenes including Baytron®-type PEDOT/PSS (poly(3,4-ethylenedioxythiophene/polystyrene sulphonate), polyanilines or their derivatives. Typically, a semi-conductive electrode comprises silicon, AsGa, Ge, SiC. The semi-conductive electrode can optionally be deposited on an insulating material such as silica, alumina or glass. Advantageously, at least one of the electrodes is transparent.

Such a cell can be produced from a glass support comprising an ITO layer previously etched with aqua regalis in order to remove a part, Cr—Au electrical contacts are then deposited on the ITO and on the glass. A layer of PEDOT-PSS (poly(3,4-ethylenedioxythiophene)-poly(styrene sulphonate)) can optionally be deposited by spin-coating. The contacts on the glass are removed. The active layer, which corresponds to the film previously disclosed, is then deposited by layer-by-layer dipping. Once the active layer is deposited, the contacts are removed and the rear face is cleaned. The supports are then placed in a frame in which the LiF—Al layer is deposited, the thickness of which generally varies between 1.3 and 70 nm, by thermal evaporation under vacuum through a mask thus defining two cells per support, the active surface of which has a surface which can be modified as required by the user. When illuminated, the current generated is recovered by the contacts placed on the aluminium (on the gold contacts) and on the ITO (on the gold contacts). The reader can usefully refer to the examples and in particular to FIG. 5.

Finally the invention relates to the use of the films, supports covered with films and devices as described previously, in the field of electronics and in particular photovoltaics and particularly in a photovoltaic cell.

The invention discloses a novel method for the manufacture of thin films containing inorganic NCs or NPs in a conjugated polymer. It is based on the use of non-covalent interactions between the NCs or NPs and the conjugated polymer. According to the disclosed arrangements, a thin film composed of NCs and a conjugated polymer can be produced simply by repeatedly dipping a support in a solution containing the polymer, then in a solution containing the NCs. The solvents used within the framework of the invention are generally of an organic type and are therefore compatible with the conjugated polymers and the NCs/NPs. The total thickness of the film is controlled on the nanometric scale by the number of layers deposited as well as by parameters such as the concentration of the solutions and dipping time of the support. The advantage of the technique also lies in the fact that the deposition of a fixing layer on the substrate is not necessary, as the functionalized polymer performs the double role of fixing the polymer onto the surface of the support and the NCs onto the polymer. Unlike the spin-coating deposition process, this method is very economical as only the deposited material is consumed. Moreover, the resulting film does not have aggregates due to a natural demixing of the two components NCs and conjugated polymer as a result of the existence of hydrogen bonds. The presence of bonds of intermediate strength, i.e. weaker than that of covalent bonds and stronger than that of Van der Waals bonds, moreover gives greater flexibility in terms of self-organization of the organic/inorganic material and makes it possible to modify its morphology by a treatment of the thermal annealing type after deposition.

The invention will be better understood on reading the embodiment presented hereinafter, which is included for the purposes of illustration only and in no way limits its scope.

FIG. 1 corresponds to the representation of two monomeric units of a polymer of 3-hexylthiophene comprising organic groups of X type, one of the monomeric units is a 3-hexylthiophene bonded to a 6-oxy-2,4-diaminopyrimidine at the end of the hexyl chain.

Figure 2:
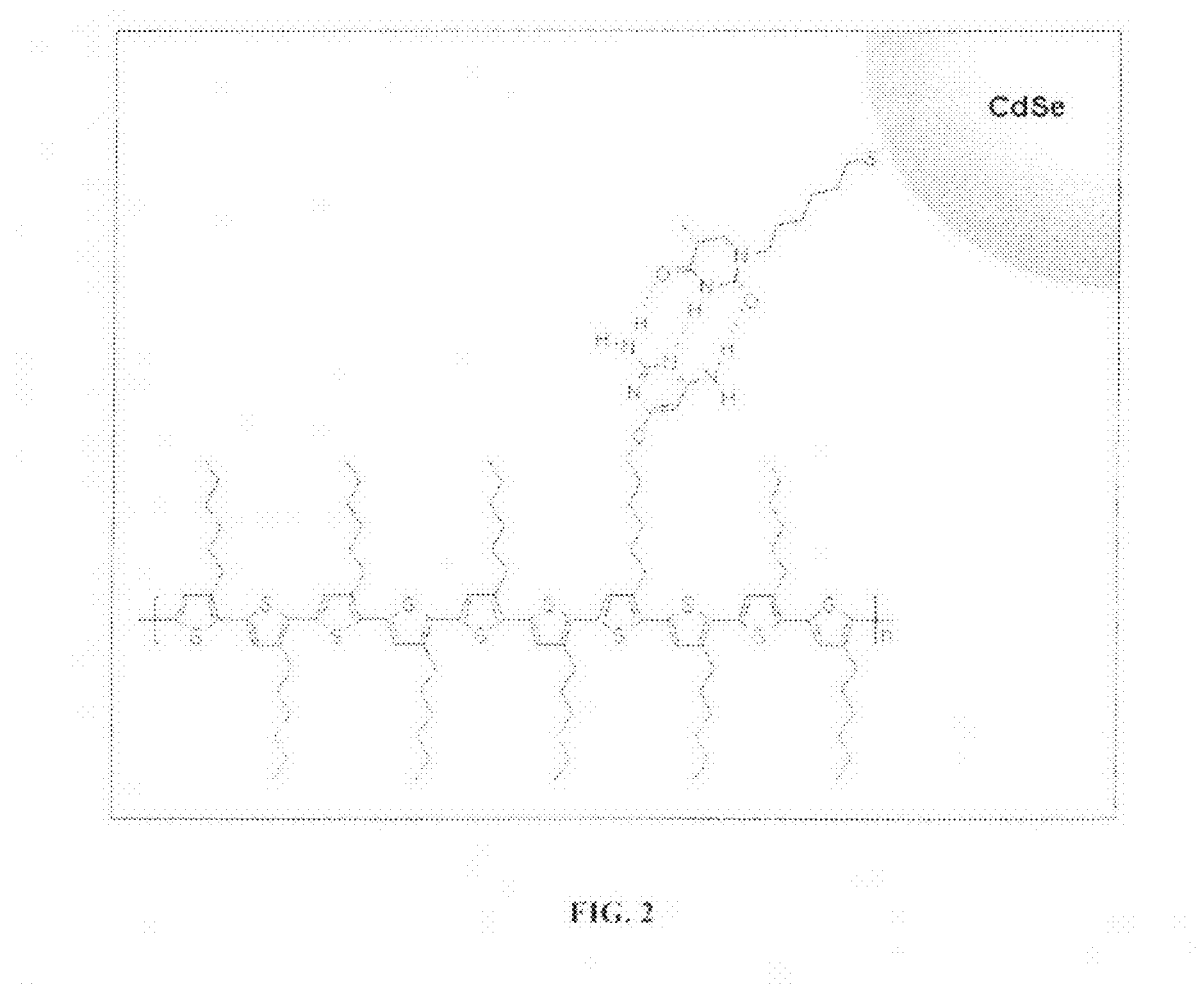

FIG. 2 corresponds to the diagrammatic representation of establishing a triple hydrogen bond between the DAP (diaminopyrimidine) group present at the end of the alkyl chain of the polymer and the Thy (thymine) group introduced by exchange reaction at the surface of NCs of CdSe.

Figure 3:
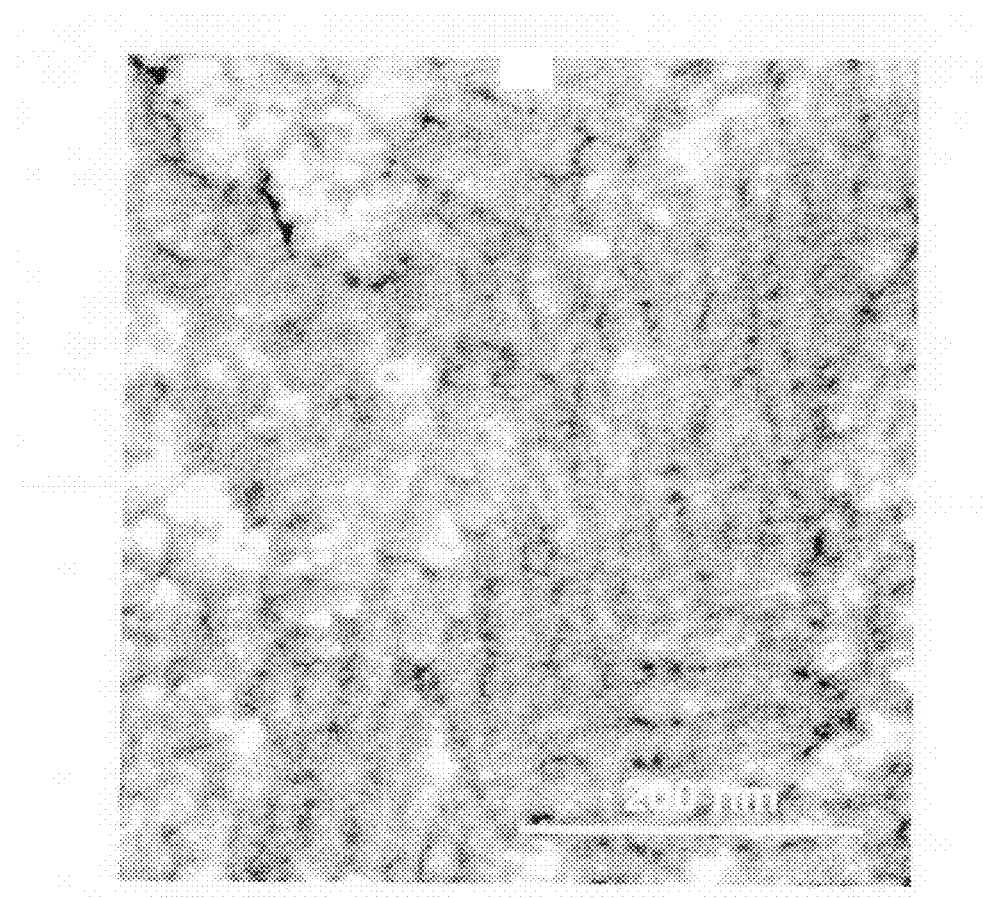

FIG. 3 corresponds to a scanning electron microscope image of a deposition of a single P3HT-DAP/CdSe-Thy bilayer on an ITO substrate.

Figure 4:
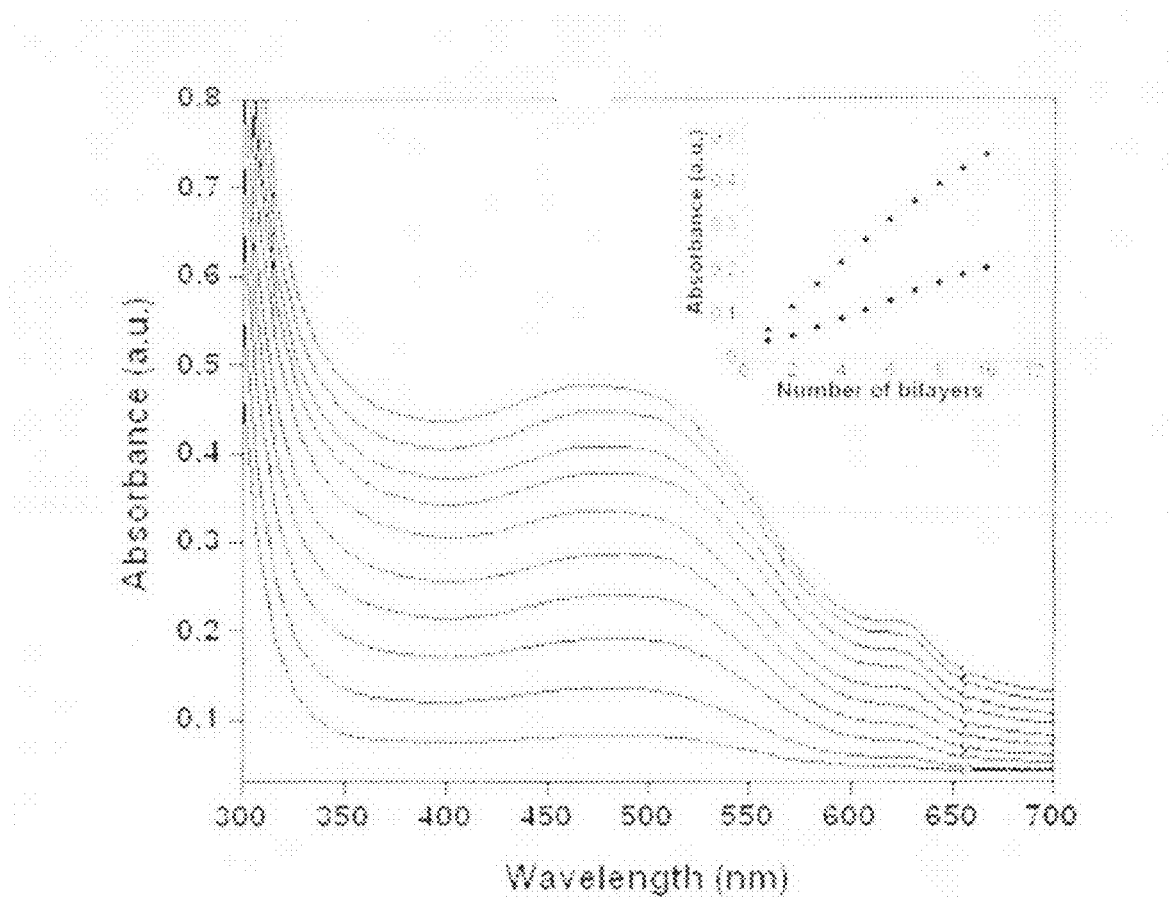

FIG. 4 represents the UV-Vis absorption spectrum recorded during the layer-by-layer deposition of the hybrid for each P3HT-DAP/CdSe-Thy bilayer, the absorbance (in arbitrary units a.u.) at a wavelength of 500 nm being characteristic of the polymer and the absorbance at 622 nm characteristic of the NCs, showing in the inset the development as a function of the number of polymer/NP bilayers.

Figure 5:
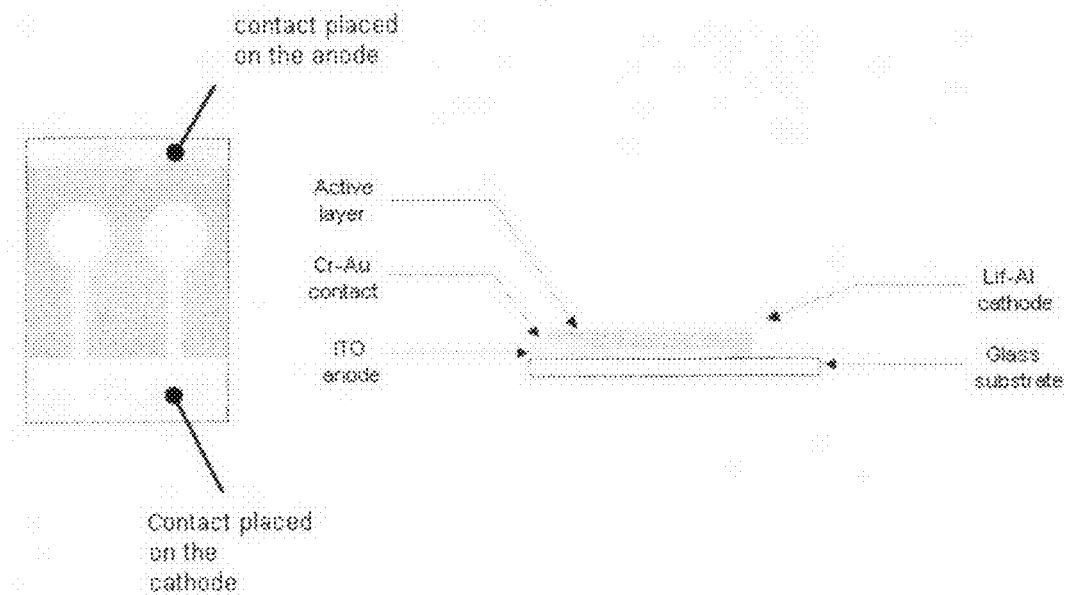

FIG. 5 corresponds to the diagrammatic representation of a photovoltaic cell.

Figure 6:
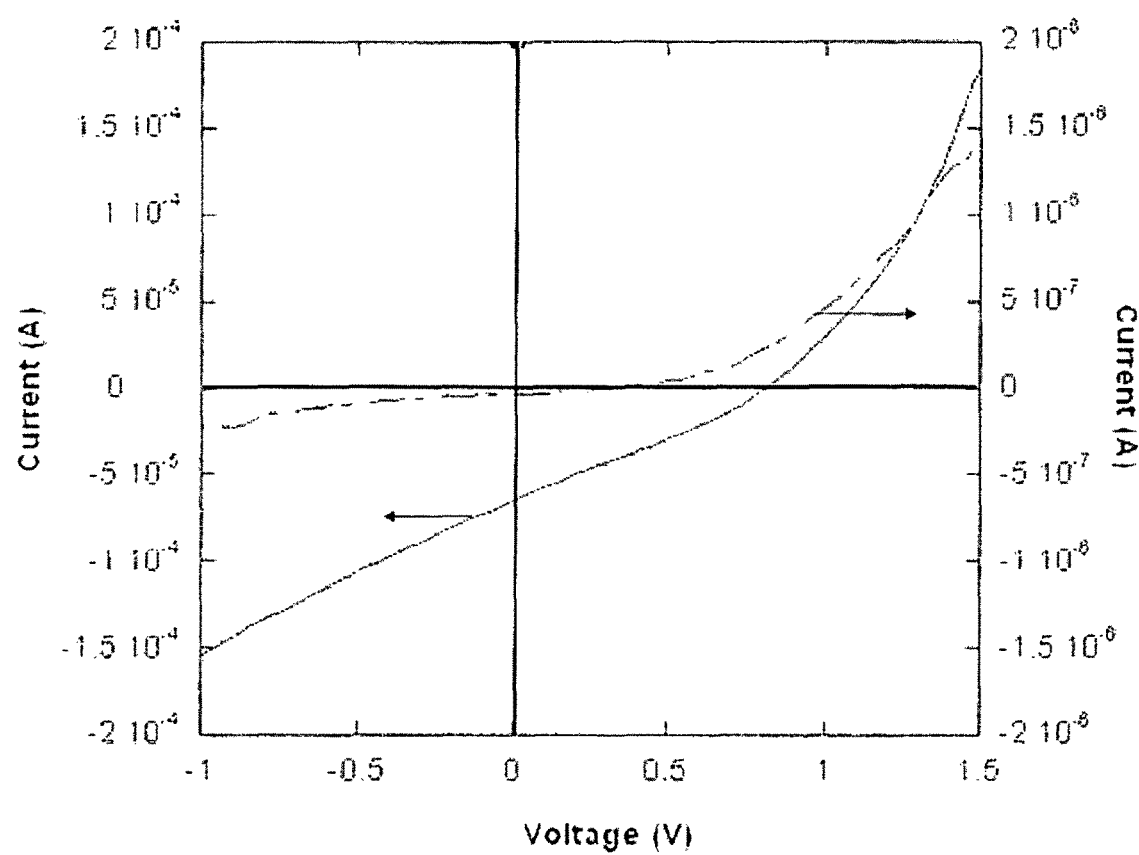

FIG. 6 corresponds to Curves I-V (current—in amperes as a function of the voltage in volts) recorded for a cell composed of 25 bilayers of P3HT-DAP/CdSe-Thy (diameter NCs=5.7 nm), the dotted curve corresponds to the characteristic I-V of the cell in the dark, the solid line shows that of the cell under illumination at a power of illumination $P_{ill}$=100 mW/cm$^2$.

EXAMPLES

1—Synthesis of a copolymer based on poly(3-hexylthiophene) comprising diaminopyrimidine functions (P3HT-DAP)

1.1—Synthesis of a functionalizable copolymer: poly (3-hexylthiophene-co-3-(6-bromohexyl)thiophene)

3-(6-Bromohexyl)thiophene was first synthesized by reaction between 3-bromothiophene and 1,6-dibromohexane according to the protocol described by de Zhai et al [Macromolecules, 2003, 36, p. 61]. The experimental setup was placed under vacuum beforehand, then under an inert atmosphere (Argon). 3-bromothiophene (5.38 g; 33 mmol) and 30 ml of anhydrous hexane were placed in a 250-ml three-necked flask, the medium was cooled down to −40° C. using an acetone/liquid nitrogen bath and stirred for 15 minutes. 1.6 M n-butyllithium was then added dropwise to the hexane (20 ml; 32 mmol) using a dropping funnel over approximately 1 hour. After stirring for 5 minutes, 5 ml of anhydrous THF was then added dropwise with a syringe over approximately 5 min, then the reaction medium was placed under stirring for one hour at −40° C. During this time a 250-ml three-necked flask purged with argon in which 1,6-dibromohexane (50 ml; 320 mmol) had been placed was prepared. After an hour the temperature of the reaction medium was no longer controlled, when it reached ambient temperature the mixture was transferred into the 1,6-dibromohexane using a bend, all under a flow of argon. After stirring at ambient temperature for 2 hours, the solution was extracted with diethyl ether (3×50 ml) and the organic phase washed with distilled water (3×50 ml). The organic fractions were dried over magnesium sulphate and the solvents evaporated off under reduced pressure. The 3-(6-bromohexyl)thiophene was then recovered by vacuum distillation.

$C_{10}H_{15}BrS$: 247.2 g/mol—Yield: 50%,

NMR $^1$H (CDCl$_3$, 200 MHz) δ (ppm): 7.26-7.22 (m, 1H); 7.13-7.10 (m); 6.94-6.92 (m, 2H); 3.40 (t, 2H); 2.79 (td); 2.64 (t, 2H); 1.86 (q, 2H); 1.64 (q, 2H); 1.51-1.30 (m, 4H).

NMR $^{13}$C (CDCl$_3$, 200 MHz) δ (ppm): 142.78; 128.13; 125.10; 119.83; 33.92; 32.65; 30.26; 30.05; 28.32; 27.90.

Ultimate analysis: Calculated: C, 48.5%; H, 6.47%; S, 12.94%; Br, 32.36%. Experimental values: C, 49.48%; H, 6.43%; S, 11.75%; Br, 32.33%.

The synthesis of 2,5-dibromo-3-(6-bromohexyl)thiophene was then carried out starting with 3-(6-bromohexyl) thiophene. 3-(6-bromohexyl)thiophene (3.0; 12 mmol), N-Bromosuccinimide (4.3 g; 24 mmol), anhydrous THF (15 ml) and acetic acid (15 ml) were introduced into a three-necked flask purged with argon, the reaction medium was then stirred for an hour. The mixture was then extracted with diethyl ether, then washed with water and with NaHCOe until a neutral pH was reached. The organic phase was then dried over magnesium sulphate, then concentrated.

$C_{10}H_{13}Br_3S$: 404.9 g/mol—Yield: 83%.

NMR $^1$H CDCl$_3$, 200 MHz) δ (ppm): 6.77 (s, 1H); 3.41 (t, 2H); 2.52 (t, 2H); 1.86 (q, 2H); 1.64-1.26 (m, 6H). Peaks allocated to the positional isomer 5-bromo-2-(6-bromohexyl) thiophene (approximately 7%): 6.86 (s) and 2.73 (t).

NMR $^{13}$C CDCl$_3$, 200 MHz) δ (ppm): 142.47; 130.74; 110.32; 107.95; 33.81; 32.53; 29.23; 29.17; 28.04; 27.76.

In order to carry out the polymerization 2,5-dibromo-3-hexylthiophene was prepared, in a manner similar to the previous protocol, from 3-hexylthiophene (2 g, 12 mmol) and NBS (4.2 g; 24 mmol) and an anhydrous THF (10 ml)/acetic acid (10 ml) mixture.

$C_{10}H_{14}Br_2S$: 326.1 g/mol—Yield: 81%.

NMR $^1$H CDCl$_3$, 200 MHz) δ (ppm): 6.76 (s, 1H); 2.50 (t, 2H); 1.53 (q, 2H); 1.38-1.22 (m, 6H), 0.88 (t, 3H).

NMR $^{13}$C: (CDCl$_3$, 200 MHz) δ (ppm): 142.85; 130.83; 110.29; 107.90; 31, 55; 29.52; 29.43; 28.78; 22.57; 14.09.

These two monomers were then copolymerized by the GRIM (Grignard metathesis) method in order to produce a statistical regioregular copolymer for which the hexylthiophene/bromohexylthiophene unit ratio is 6 to 1. This polymer was then fractionated using a sequence of solvents in order to reduce its polydispersity, and subsequently the fraction extracted with dichloromethane was used for the post-functionalization ($M_n$=12800 g/mol; $M_p$=22200 g/mol; $I_p$=1.73).

The synthesis was carried out in a setup under an inert atmosphere (Argon). 2,5-dibromo-3-(6-bromohexyl) thiophene (1.17 g; 2.8 mmol) to which 10 ml of anhydrous THF then tert-butyl magnesium chloride (1.73 ml; 2M in diethyl ether) had been added were placed in a first three-necked flask, the mixture was then heated under reflux for 2 hours. Tert-butyl magnesium chloride (5.22 ml; 2M in diethyl ether) was introduced into a second three-necked flask containing 2,5-dibromo-3-hexylthiophene (2.8 g; 8.6 mmol) in anhydrous THF (30 ml), the resulting mixture was then heated under reflux for 2 hours. The contents of the first three-necked flask were transferred to the second by means of a cannula under a flow of argon. Polymerization was then initiated by the addition of 1,3-(diphenylphosphino)propane nickel (II) chloride (Ni(dppp)Cl2) (32 mg, 0.059 mmol), and the reaction medium maintained under stirring for one hour under reflux. After cooling the medium to ambient temperature, the polymer was precipitated from 200 ml of methanol. The polymer was then washed three times with methanol.

The initial ratio of the monomers introduced is 1 molar equivalent of 3-(6-bromohexylthiopene) to 3 molar equivalents of 3-(hexylthiophene). The proportion of 3-(6-bromohexyl)thiophene units incorporated in the copolymer chains is 1 to 5 as determined by the integration of the characteristic proton NMR peaks and confirmed by ultimate analysis.

NMR $^1$H CDCl$_3$, 200 MHz) δ (ppm): the peaks specific to the 3-(6-bromohexyl)thiophene unit are underlined: 6.98 (s, 1H); 3.43 (t, 2H); 2.80 (t 2H); 1.90 (m, 2H); 1.71 (m, 2H); 1.37 (m, 6H); 0.91 (t, 3H).

NMR $^{13}$C CDCl$^3$, 200 MHz) δ (ppm): the peaks specific to the 3-(6-bromohexyl)thiophene unit are underlined: 139.86; 133.65; 130.42; 128.57; 33.92; 32.69; 31.68; 30.49; 29.44; 29.25; 28.60; 27.97; 22.65; 14.13.

Ultimate analysis: calculated: C, 66.98%; H, 7.72%; Br, 7.44%; S, 17.86%. Experimental values: C, 65.98%; H, 7.74%; Br, 7.32%; S, 16.33%.

IRTF-ATR: 3040w, 2942m, 2920s, 2850s, 2784w, 1504m, 1452s, 1374m, 1254w, 1198w, 1094s, 822s, 724m.

At the end of the copolymerization the polymer has a molar mass polydispersity ($M_n$=9200 g/mol; $M_p$=23500 g/mol; $I_p$=2.57) which had been reduced by selective extractions. The polymer obtained was dried under reduced pressure and the powder obtained ground finely before being introduced into a cellulose cartridge placed in a Soxhlet extractor. The hot extraction of the polymer was then carried out using a sequence of solvents used in a standard fashion for the poly-alkylthiophenes, in the following order: acetone, hexane, dichloromethane, tetrahydrofuran and chloroform. The extraction of the oligomers was carried out with acetone and hexane, the longer chains were extracted with THF and chloroform, the dichloromethane made it possible to recover the intermediate-sized chains. This sequence was preceded by hot extraction with methanol in order to remove all traces of catalyst and the monomers which had not reacted.

1,2-Post-functionalization of poly (3-hexylthiophene-co-3-(6-bromohexyl)thiophene)

The functionalization of this polymer by the diaminopyrimidine (DAP) functions was obtained by reaction of the copolymer with 2,4-diamino-6-hydroxypyrimidine in a basic medium, the reaction consisted of substituting the bromines at the end of the alkyl chain with oxy-diaminopyrimidine functions. Finally, the copolymer obtained had a hexylthiophene/DAP-hexylthiophene units ratio of 9 to 1. The copolymer obtained was soluble in chloroform.

More precisely, the synthesis was carried out by adding 12 ml of anhydrous DMSO, 39.8 mg of $K_2CO_3$ and 20 ml of anhydrous THF to a mixture of poly (3-hexylthiophene-co-3-(6-bromohexyl)thiophene) (Mn=12800 g/mol, 55.2 mg) and 2,4-diamino-6-hydroxypyrimidine (357.2 mg, 2.83 mmol) placed beforehand in a three-necked flask under argon. The resulting mixture was placed under stirring and taken to reflux for 18 hours. The reaction medium was then precipitated from methanol and the polymer filtered and washed with methanol.

NMR $^1$H (CDCl$_3$, 200 MHz) δ (ppm): 6.98 (s, 1H); 5.21 (s, 1H); 4.67 (s, 2H); 4.48 (s, 2H); 4.15 (t, 2H); 2.80 (t, 2H); 1.70 (m, 2H); 1.36 (m, 6H); 0.91 (t, 3H).

IRTF-ATR: 3464w, 3332w, 3162w, 3048w, 2920s, 2850s, 2642w, 1580s, 1502m, 1450s, 1420s, 1372m, 1250w, 1196m, 1150w, 1014m, 820s, 796s, 720m, 660w.

II—Synthesis of the 1-(6-mercaptohexyl)thymine (MHT) Ligand

The synthesis of this ligand was carried out according to the protocols of Nowick [J. Am. Chem. Soc. 1993, 115, p. 7636] and Matsuura [Langmuir 1997, 13, p. 814]. According to this operating procedure the 1-(6-bromohexyl)thymine was firstly synthesized by reaction of the thymine protected with 1,6-dibromohexane then the thiol function was introduced by reaction with thiourea in order to produce 1-(6-mercaptohexyl)thymine (MHT).

III—Synthesis of the Nanocrystals of CdSe

The synthesis protocol which was used is derived from the method described in *Angew. Chem. Int. Ed.* 2002, 41, p. 2368. The NCs which were obtained had sizes comprised between 3 and 6 nm, their diameter was determined by transmission electron microscopy (TEM).

Synthesis of nanocrystals of CdSe 3.7 nm in diameter 0.4 mmol of cadmium oxide (CdO), 10 mmol of stearic acid, 10 mmol of oleylamine and 20 ml of octadecene (ODE) were placed in a three-necked flask surmounted by a condenser and degassed under rough vacuum for 15 minutes, the flask was placed under an inert atmosphere (Argon) and heated to 250° C. A solution containing 5 ml of a solution of Se dissolved in trioctylphosphine (TOP—Se) at a concentration of 0.4 M and 8.3 ml of ODE, was then injected rapidly into the medium.

Synthesis of Nanocrystals of CdSe 4.5 nm in Diameter

The synthesis protocol was similar to the previous one, being modified as follows: 0.4 mmol of CdO, 10 mmol of stearic acid, 14 ml of oleylamine, 9 ml of ODE, the injected solution comprised 5 ml of a 0.4 M TOP—Se solution diluted with 3.3 ml of ODE and 5 ml of oleylamine.

Synthesis of nanocrystals of CdSe 5.8 nm in Diameter

The synthesis protocol was similar to the previous one, the quantities of reagents being modified as follows: 0.8 mmol of CdO, 40 mmol of stearic acid, 5.3 ml of ODE not of oleylamine, the injected solution comprised 1 ml of a 0.4 M TOP—Se solution diluted with 1.7 ml of ODE, moreover the synthesis temperature was 300° C.

IV—Exchange of Ligands at the Surface of the Nanocrystals of CdSe: Obtaining the CdSe-Thy Functionalized NCs The nanocrystals of CdSe, covered with their original ligand (stearic acid) were subjected to an exchange reaction carried out in solution in chloroform by the addition of a known excess of MHT ligand, with 20 to 50 times the number of moles of stearate ligand at the surface of the nanocrystals. The nanocrystals functionalized by MHT lose their solubility in chloroform, but are soluble in solvents such as dimethylsulphoxide and N,N-dimethylformamide. The exchange rate with the MHT, determined by NMR $^1$H spectroscopy and thermogravimetry, depends on the reaction conditions.

1-(6-mercaptohexyl)thymine (67.2 mg, 0.28 mmol) was added to 30 ml of a solution of nanocrystals of CdSe (diameter=6.1 nm) in chloroform (0.674, $10^{-6}$ M), then the reaction mixture was heated at 50° C. for 3 days. At the end of the exchange the nanocrystals were isolated by filtration as their solubility is low in chloroform. The filtrate was washed with chloroform to remove the excess of 1-(6-mercaptohexyl) thymine and the exchanged stearic acid. The nanocrystals were then solubilized in DMSO-d6 in order to determine the exchange rate by $^1$H NMR. In this case the rate of 1-(6-mercaptohexyl)thymine at the surface of the nanocrystals was 20%.

The rate can be increased by carrying out the exchange in a microwave oven. Thus, after mixing 1-(6-mercaptohexyl) thymine (70.1 mg, 0.29 mmol) with 17 ml of a solution of nanocrystals of CdSe (diameter=6.1 nm) in chloroform ($1.27 \cdot 10^{-6}$ M) the reaction medium was placed in a microwave oven which was set at a temperature of 45° C. for a power of 60 W. The rise in temperature was programmed over a time lapse of 15 min, then the medium placed at 45° C. for one hour finishing with a reduction to ambient temperature over 20 min. The nanocrystals were purified in the same way as for the exchange reaction by standard route. This time the exchange rate was estimated at 70%.

V—Synthesis of NPs of Au

The synthesis protocol which was used followed the methods described in Chem. Commun. 1994, p. 801 & J. Phys. Chem. 2003, 107, p. 7406. The NPs which were obtained had sizes comprised between 2.5 and 6 nm, determined by TEM (transmission electron microscopy).

VI—Exchange of Ligands at the Surface of the Nanoparticles of Au: Obtaining the Au-Thy Functionalized NPs The NPs of Au, covered by their original ligand (octanethiol) were subjected to an exchange reaction carried out by the addition of a known excess of MHT ligand (50 times the number of moles of the original ligands, octanethiol). The NPs functionalized by MHT are soluble in solvents such as dimethylsulphoxide and N,N-dimethylformamide. The exchange rate with MHT depends on the reaction conditions and is determined by NMR $^1$H spectroscopy. For an exchange reaction carried out at 45° C. in chloroform over 3 hours, the exchange rate which was obtained was approximately 80%.

VII—Production of Thin Films of NCs of CdSe

P3HT by the Layer-By-Layer Deposition Technique

A solution of the polymer P3HT-DAP in chloroform (1 g/L) and a dispersion of the nanocrystals CdSe-Thy in a mixture of N,N-dimethylformamide:methanol (10:1; approximately 0.2 g/L) were introduced into two beakers. A parallelepipedic glass slide with a thickness of 1.1 mm, on one of the large surfaces of which ITO (indium tin oxide, with surface resistivity of 8-12 Ω/sq, supplied by ALDRICH®), cleaned beforehand by immersion for 15 min under ultrasounds in ethanol then 15 min under ultrasound in acetone before being dried in an oven, had been deposited, was used to carry out the deposition. The first layer was produced by dipping the support in the polymer solution for 2 min then rinsing with chloroform and drying under a flow of argon. The support was then immersed in the solution of NCs of CdSe for 5 min then rinsed with chloroform and dried under a flow of argon. FIG. 2 diagrammatically represents the interaction between a nanocrystal and a polymer molecule.

The support, after deposition of a layer of polymer and a layer of NCs, was observed by electronic microscopy in order to verify the very homogeneous dispersion of the NPs on the support, the image obtained is shown in FIG. 3, in which the irregular structure which corresponds to the rough surface of ITO can be made out in the background, the nanocrystals of CdSe appearing in the form of small white grains in the foreground. The operation of alternately dipping in these two solutions was repeated until 25 layers of each of the species were obtained. The growth of the film was monitored by UV-Vis absorption spectroscopy as shown in FIG. 4.

VIII—Production of Thin Films of NPs of Au

P3HT by the Layer-By-Layer Deposition Technique

The protocol is the same as that described in VII using a dispersion of Au-Thy NPs instead of CdSe-Thy NCs.

IX—Photovoltaic Device

In order to produce a photovoltaic cell, a film comprising 25 bilayers of P3HT-DAP/CdSe-Thy (diameter of NCs=5.7 nm, covering of the surface with MHT=68%, with stearate 32%) was first deposited on a glass support partly covered with ITO, and having two electrical contacts of Cr—Au type (FIG. 5), by the layer-by-layer deposition method according to the methods presented in VII. A layer of LiF (1.3 nm) then of aluminium (70 nm) were deposited by thermal evaporation under vacuum through a mask allowing the definition of the active surface of the cell (2.8 cm$^2$). The device prepared corresponds to that which is represented in FIG. 5. The solar cell produced in this way was tested under AM 1.5 white light with an illumination power of 100 mW/cm$^2$. The results obtained in the form of current-voltage curves (I=f(V)) reveal a photovoltaic effect as appears in FIG. 6. From these characteristic curves it is possible to extract the open circuit potential values $V_{OC}$=0.82 V, a short-circuit current density value $J_{SC}$=6.5·10$^{-5}$ A/cm, as well as a value of 0.28 for the fill factor FF=$J_M V_M/(J_{SC} V_{OC})$ with $J_M$ and $V_M$ being current and potential values resulting from the maximum power supplied by the solar cell. From these values, it is possible to calculate a conversion yield of the cell ($\eta$) of 0.015% according to the formula $\eta=J_{sc}V_{oc}FF/P$ with P signifying the integrated irradiation power for the surface of the device.

The invention claimed is:

1. Process for the non-covalent coating of a support by a hybrid organic/inorganic film comprising the steps of:
depositing a conjugated organic polymer comprising organic groups of X type onto the support;
depositing nanoparticles comprising one or more organic groups of Y type onto the support;
wherein said groups of X and Y types are capable of developing hydrogen-type bonds between themselves, and
wherein the conjugated organic polymer comprising the organic groups of X type is a poly(3-hexylthiophene) functionalized by a diaminopyrimidine function.

2. Process according to claim 1, wherein the deposition steps are repeated alternately.

3. Process according to claim 1, wherein X and Y have within them, in the case of X the carbon-containing structure of formula (I):

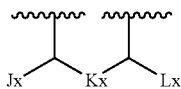

and in the case of Y the carbon-containing structure of formula (II):

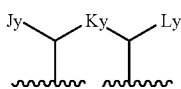

and wherein
hydrogen bonds are capable of forming in at least two of the pairs Jx/Jy, Kx/Ky, Lx/Ly;
for the pair Jx/Jy, one of the Jx and Jy represents an N or an O covalently bonded to a hydrogen and the other represents an N or an O $\pi$-type bonded with an atom;
for the pair Kx/Ky, one of the Kx and Ky represents a nitrogen atom covalently bonded to a hydrogen, and the other represents an N $\pi$-type bonded with an atom;
for the pair Lx/Ly, the Lx and Ly independently represent hydrogen or carbon atoms, an N or an O covalently bonded to a hydrogen, or at least one N or one O $\pi$-type bonded with an atom.

4. Process according to claim 3, wherein X and Y correspond to a pair of diaminopyrimidine/thymine.

5. Process according to claim 1, wherein the nanoparticles have an inorganic core constituted by at least one metal and/or at least one semi-conductor compound comprising at least one metal, to which at least one ligand, of organic nature, comprising an organic group of Y type is bonded.

6. Process according to claim 5, wherein the metal and/or at least one semi-conductor compound comprising at least one metal is chosen from CdSe, CdTe, ZnO, PbSe, PbS, InP, InN, CuInS$_2$, CuInSe$_2$, Cu(In,Ga)Se$_2$, GaAs, InGaAs, Si, Ge, Au, Ag and Pt.

7. Method according to claim 5, wherein the ligand is of formula (III):

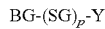

in which:
BG represents a linkage group capable of binding to the nanoparticles;
SG represents a spacer group;
p is equal to 0 or 1; and
Y is as defined previously.

8. Process according to claim 7, wherein BG is a thiol, a dithiol, a carbodithioate, a dithiocarbamate, a xanthate, a carboxylic acid, a dicarboxylic acid, a phosphonic acid, a diphosphonic acid, a sulphonic acid or a hydroxamic acid.

9. Process according to claim 7, wherein the spacer is aliphatic in nature.

10. Process according to claim 1, wherein the support is chosen from glass, mica, silicon having an oxide layer, and indium tin oxide.

11. Process according to claim 1, wherein the deposition steps are carried out by dipping the support in solutions of conjugated organic polymer comprising organic groups of X type and nanoparticles comprising one or more organic groups of Y type.

12. A support coated with a film, capable of being obtained according to the process according to claim 11.

13. Electronic device, comprising:
a support partly coated with the film according to claim 12;
a metallic layer over at least part of the film;
electrical contacts established between a part of the support not covered with the film, which constitutes an anode, and the metallic layer, which constitutes a cathode.

14. A photovoltaic cell comprising the support coated with the film according to claim 12.

15. Hybrid organic-inorganic multilayer film comprising:
m layers of conjugated organic polymer comprising organic groups of X type;
n layers of nanoparticles comprising one or more organic groups of Y type; m and n being greater than or equal to 1,
wherein said groups of X and Y types are capable of developing hydrogen-type bonds between themselves and
wherein the conjugated organic polymer comprising the organic groups of X type is a poly(3-hexylthiophene) functionalized by a diaminopyrimidine function.

16. Electronic device, comprising:
a support partly coated with the film according to claim 15;
a metallic layer over at least part of the film;
electrical contacts established between a part of the support not covered with the film, which constitutes an anode, and the metallic layer, which constitutes a cathode.

17. A photovoltaic cell comprising the hybrid organic-inorganic multilayer film according to claim 15.

18. A support coated with a hybrid organic-inorganic multilayer film comprising:
m layers of conjugated organic polymer comprising organic groups of X type;
n layers of nanoparticles comprising one or more organic groups of Y type; m and n being greater than or equal to 1,
wherein said groups of X and Y types are capable of developing hydrogen-type bonds between themselves and
wherein the conjugated organic polymer comprising the organic groups of X type is a poly(3-hexylthiophene) functionalized by a diaminopyrimidine function.

19. A photovoltaic cell comprising the support coated with the film according to claim 18.